(12) United States Patent
Rusch et al.

(10) Patent No.: US 10,938,081 B2
(45) Date of Patent: Mar. 2, 2021

(54) PLUG CONNECTION ARRANGEMENT AND SYSTEM HAVING SUCH PLUG CONNECTION ARRANGEMENT

(71) Applicant: TE Connectivity Germany GmbH, Bensheim (DE)

(72) Inventors: Christian Rusch, Schifferstadt (DE); Christian Mandel, Darmstadt (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 16/144,281

(22) Filed: Sep. 27, 2018

(65) Prior Publication Data

US 2019/0097294 A1 Mar. 28, 2019

(30) Foreign Application Priority Data

Sep. 28, 2017 (DE) .......................... 102017122600.1

(51) Int. Cl.
*H01P 5/02* (2006.01)
*H01P 3/16* (2006.01)
(Continued)

(52) U.S. Cl.
CPC ................ *H01P 3/16* (2013.01); *H01P 5/087* (2013.01); *H01P 5/18* (2013.01); *H01Q 13/20* (2013.01); *H01Q 19/30* (2013.01); *H01R 12/00* (2013.01); *H01R 12/72* (2013.01); *H01R 24/50* (2013.01); *H01R 24/64* (2013.01); *G02B 6/421* (2013.01); *G02B 6/4292* (2013.01); *H05K 1/0243* (2013.01)

(58) Field of Classification Search
CPC .... H01P 5/02; H01P 5/08; H01P 5/087; H01P 5/1022; H01P 3/16; H01R 24/64; G02B 6/4292

See application file for complete search history.

(56) References Cited

U.S. PATENT DOCUMENTS 9,373,878 B2   6/2016 Schuppener et al.
9,466,884 B2  10/2016 Pu et al.
(Continued)

FOREIGN PATENT DOCUMENTS

DE    10 2015 105 657 A1   10/2016
EP           2573951 A1    3/2013
FR           3022696 A1   12/2015

OTHER PUBLICATIONS

European Patent Office Communication, dated Apr. 14, 2020, 6 pages.

*Primary Examiner* — Stephen E. Jones
(74) *Attorney, Agent, or Firm* — Barley Snyder

(57) ABSTRACT

A plug connection arrangement for mechanically and electromagnetically coupling a radiation source to a dielectric waveguide and a system for transmitting data by electromagnetic radiation. The plug connection arrangement has a housing which can be mounted on a printed circuit board. The radiation source generates electromagnetic waves. The radiation source is enclosed, in a mounted state, on the printed circuit board, at least in sections, by the housing and the receiving unit for receiving and aligning the dielectric waveguide is connected to the housing. The dielectric waveguide, which can be received by the receiving unit, in the received state, can be electromagnetically coupled to the radiation source.

22 Claims, 7 Drawing Sheets

(51) Int. Cl.
*H01P 5/08* (2006.01)
*H01P 5/18* (2006.01)
*H01Q 13/20* (2006.01)
*H01Q 19/30* (2006.01)
*H01R 12/00* (2006.01)
*H01R 12/72* (2011.01)
*H01R 24/50* (2011.01)
*H01R 24/64* (2011.01)
*G02B 6/42* (2006.01)
*H05K 1/02* (2006.01)

(56) References Cited

U.S. PATENT DOCUMENTS

| | | |
|---|---|---|
| 9,490,518 B1 | 11/2016 | Herbsommer et al. |
| 2012/0153969 A1 | 6/2012 | Eckert et al. |
| 2015/0372388 A1* | 12/2015 | Martineau .............. H01P 3/16 343/785 |
| 2016/0036114 A1 | 2/2016 | Okada |
| 2016/0204495 A1 | 7/2016 | Takeda et al. |
| 2016/0308266 A1* | 10/2016 | Hammerschmidt ..... H01Q 1/50 |

* cited by examiner

Fig. 2a
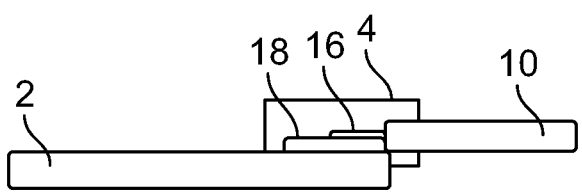
Fig. 2b
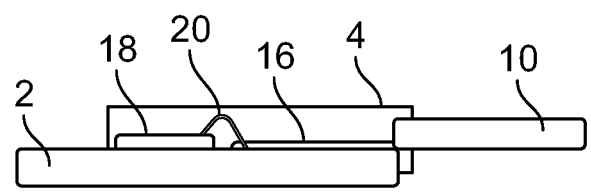
Fig. 2c
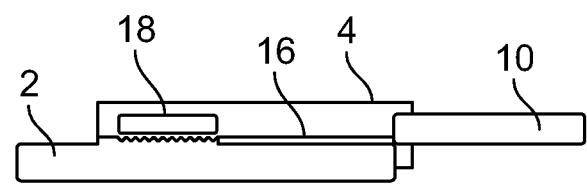
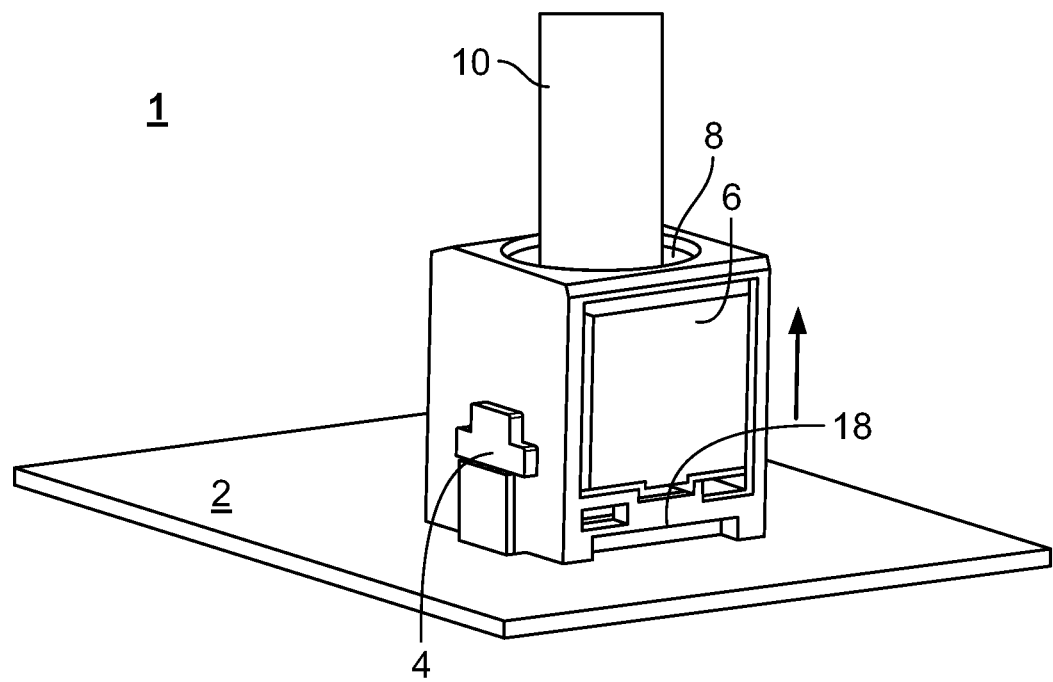
Fig. 3

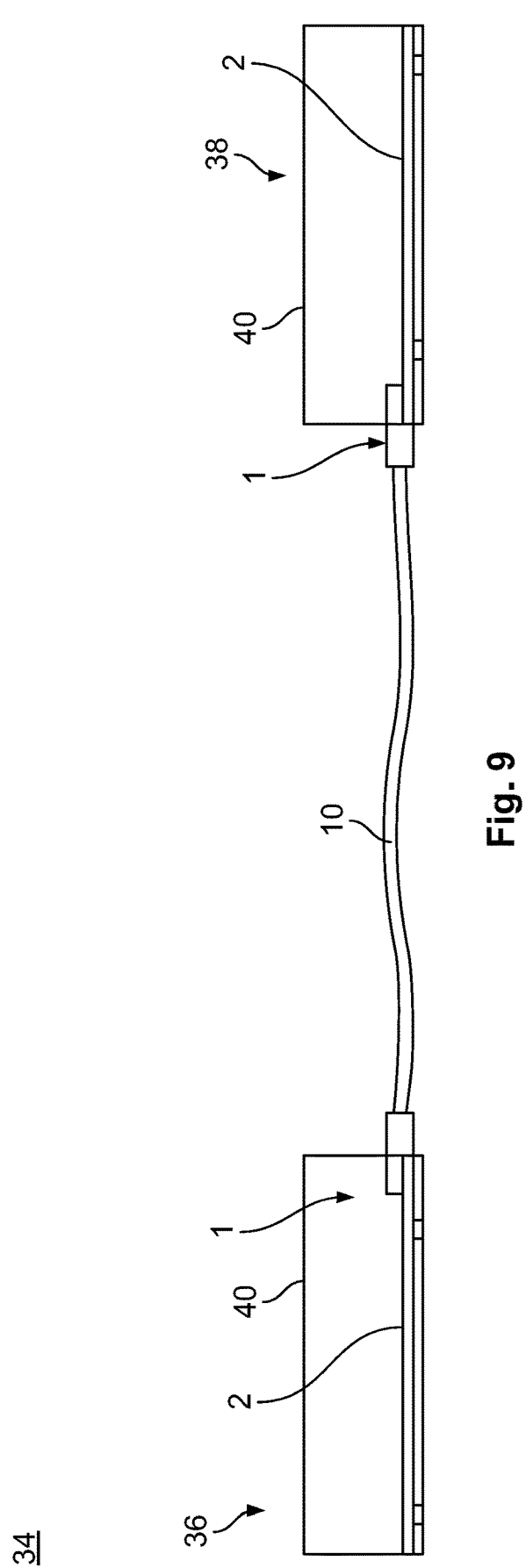

PLUG CONNECTION ARRANGEMENT AND SYSTEM HAVING SUCH PLUG CONNECTION ARRANGEMENT

CROSS-REFERENCE TO RELATED APPLICATION

This application claims the benefit of the filing date under 35 U.S.C. § 119(a)-(d) of German Patent Application No. 102017122600.1 filed Sep. 28, 2017.

FIELD OF THE INVENTION

The present invention relates, in general, to data transmission and, in particular, to a low-loss plug connection arrangement and a data transmitting system that includes such a plug connection arrangement.

BACKGROUND

Systems with high-frequency carrier signals can be used for future communication methods with high data transmission rates. Such high-frequency carrier signals are electromagnetic rays with a wavelength in the millimeter or micrometer range. However, radiation sources provided for this purpose have a limited available power in the frequency range limited for a data transmission. In order to be able to guarantee a data transmission, receiving units require a defined minimum signal strength.

In particular, in the automobile industry, transmission lengths for electromagnetic radiation of between 10 and 15 m are required. With dielectric waveguides, the electromagnetic rays can be guided over these transmission lengths. Due to the losses inside the dielectric waveguides and in the plug connections or couplings of the dielectric waveguides, guaranteeing the defined minimum signal strength can be problematic. The dielectric waveguides must thus have as low an attenuation as possible of the transmitted electromagnetic radiation. The dielectric waveguides can be established with regard to a material selection, length and arrangement. Moreover, optimizations of the actuators or the radiation sources and the dielectric waveguides are often only possible with great effort.

SUMMARY

In accordance with the present invention, a plug connection arrangement for mechanically and electromagnetically coupling a radiation source to a dielectric waveguide includes a housing adapted to be mounted on a printed circuit board and a radiation source for generating electromagnetic waves enclosed at least in sections by the housing. This plug connection arrangement also includes a dielectric waveguide electromagnetically coupled to the radiation source directly or through the material of the housing and a receiving unit receiving and aligning the dielectric waveguide and connected to the housing.

A system constructed in accordance with the present invention transmits data by electromagnetic radiation between a first controller and a second controller. Each controller has a controller housing with a plug connection arrangement that includes a housing adapted to be mounted on a printed circuit board and a radiation source for generating electromagnetic waves enclosed at least in sections by the housing. The one plug connection arrangement also includes a dielectric waveguide electromagnetically coupled to the radiation source directly or through the material of the housing outside the controller housing and a receiving unit receiving and aligning the dielectric waveguide and connected to the housing.

BRIEF DESCRIPTION OF THE DRAWINGS

Preferred exemplary embodiments of the invention are explained hereinafter in greater detail using greatly simplified schematic depictions. In the drawings

FIGS. 2a, 2b, and 2c are sectional views of various arrangements of a signal source in the FIGS. 1a and 1b plug connection arrangement;

FIG. 3 is a perspective view of a plug connection arrangement according to a second exemplary embodiment of the present invention;

FIG. 6b is a perspective view of a one-part connecting element of the plug connection arrangement of FIG. 6a;

FIG. 7b is a perspective view of a one-part connecting element of the plug connection arrangement of FIG. 7a;

FIG. 8b is a perspective view of a multi-part connecting element of the plug connection arrangement of FIG. 8a;

FIG. 9 is a side view of a system for transmitting data according to an exemplary embodiment of the present invention.

DETAILED DESCRIPTION OF THE EMBODIMENT(S)

In the figures, the same structural elements each have the same reference numbers.

Figure 1A:
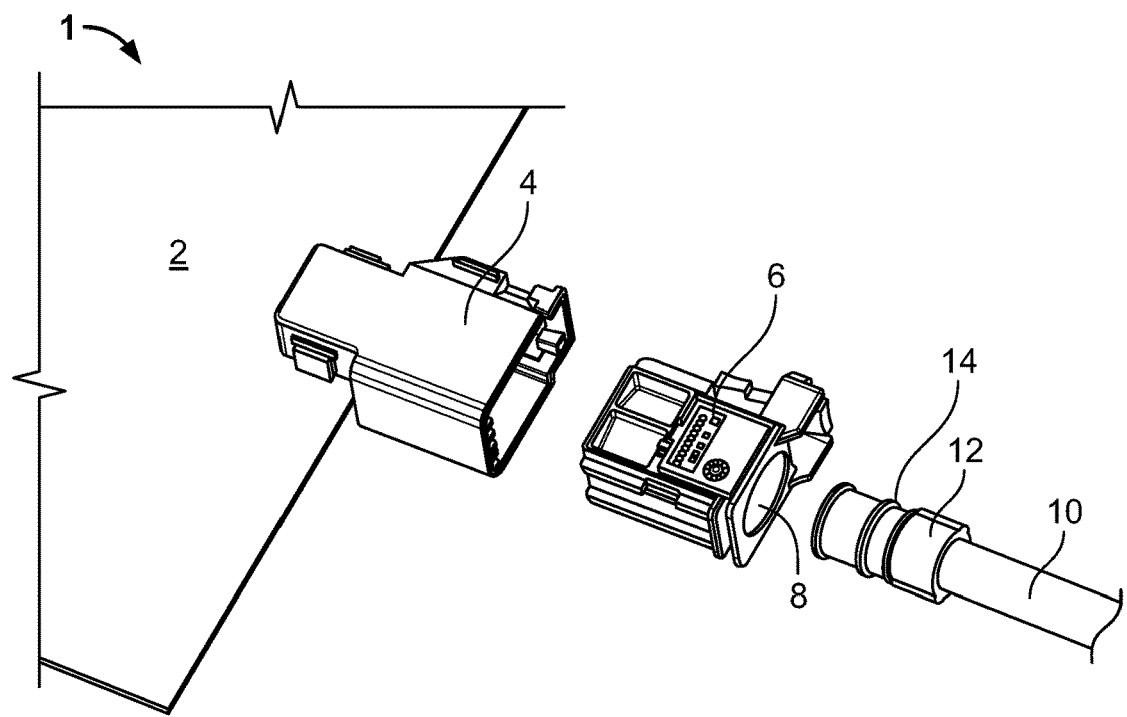
FIG. 1a is an exploded perspective view of a plug connection arrangement according to a first exemplary embodiment of the present invention.
Figure 1B:
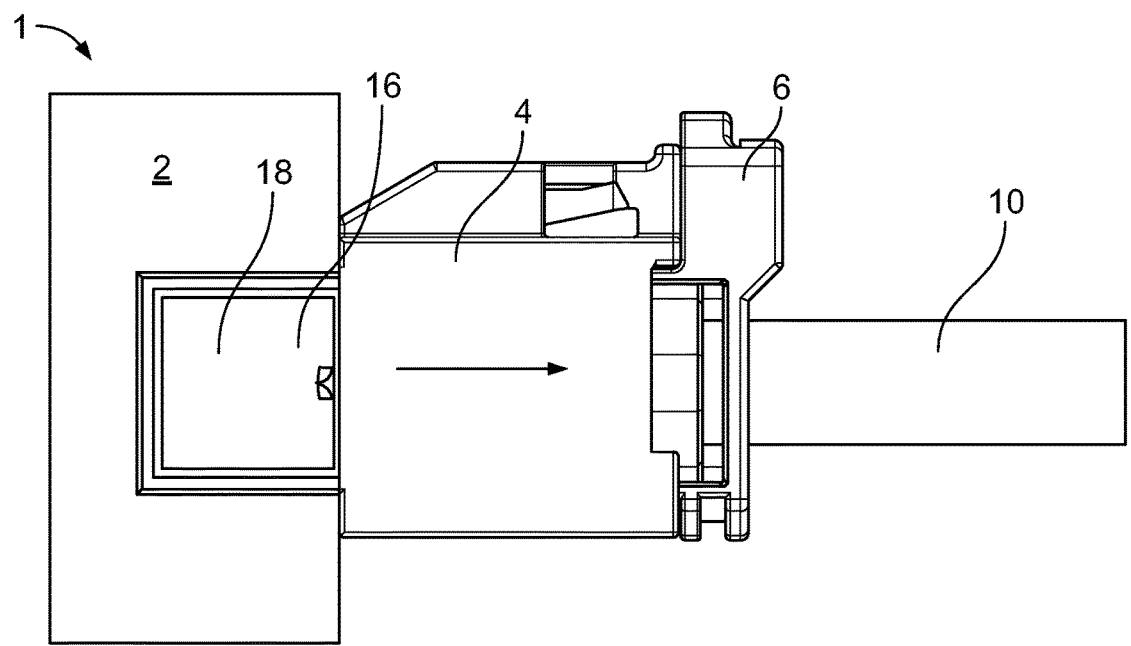
FIG. 1b is a plan view of the FIG. 1a plug connection arrangement.

FIG. 1a is an exploded perspective view of a plug connection arrangement 1 constructed in accordance with a first exemplary embodiment of the present invention. The plug connection arrangement 1 has a housing 4 on a printed circuit board 2. The housing 4 is mounted on a rim of the printed circuit board 2 and projects beyond the rim of the printed circuit board 2. A receiving unit 6 can be inserted into the housing 4 in a form-fitting manner. The receiving unit 6 can engage, in a releasable manner, the housing 4 in accordance with this exemplary embodiment of the present invention. The receiving unit 6 has a cylindrical opening 8 for receiving, at its end, a dielectric waveguide 10. In this case, the dielectric waveguide 10 has, at its end, a sleeve 12 with a circumferential recess 14. The waveguide 10 can be received in an engageable manner by the receiving unit 6 at a defined insertion depth by means of the recess 14. In this case, the receiving unit 6, in a state arranged in the housing 4, projects into the housing 4 such that the inserted waveguide 10 can be spaced apart at its ends with a minimal spacing from a radiation source 16 positioned in the housing 4 as shown in FIG. 1b. The waveguide 10, at its ends, advantageously does not have a spacing from the radiation source 16. The waveguide 10 is aligned parallel to a planar elongation of the printed circuit board 2 relative to the radiation source 16 by the receiving unit 6.

FIG. 1b is a plan view of a plug connection arrangement 1 of FIG. 1a. For reasons of clarity, the housing 4 is not represented in the region of the printed circuit board 2, such that an integrated switching circuit 18 and a radiation source 16 arranged on the integrated switching circuit 18 are visible. The receiving unit 6 and the waveguide 10 received by the receiving unit 6 are directly adjacent to the radiation source 16 in the inserted state. As a result of this, the radiation source 16 can couple the generated electromagnetic rays into the waveguide 10. The waveguide 10 can be aligned precisely to the radiation source 16 by the receiving unit 6. According to this exemplary embodiment of the present invention, the radiation source 16 is a so-called "end-fire" antenna. In particular, the radiation source can be a Vivaldi antenna, a Yagi antenna, a horn antenna, or a so-called "tapered substrate integrated waveguide" antenna. The integrated switching circuit as actuator 18 of the radiation source 16 and the radiation source 16 are in this case arranged in the housing 4 and are connected in an electrically conductive manner to the printed circuit board 2 by a surface mounting of the housing 4. The arrow here illustrates a main radiation direction of the radiation source 16 or a direction of the main lobe of the radiation source 16.

FIGS. 2a, 2b, and 2c are sectional views of various arrangements of a radiation source 16 in the FIGS. 1a and 1b a plug connection arrangement 1. Some exemplary possibilities for arranging the radiation source 16 and the actuator 18 of the radiation source 16 and the waveguide 10 aligned corresponding to the radiation source 16 are illustrated. As illustrated, the actuator 18 can also be arranged outside of the housing 4. The radiation source 16 can, for example, be arranged on the actuator 18 or an integrated circuit 18 of the actuator. In particular, the radiation source 16 can also be integrated into the integrated circuit 18. As a further alternative, the radiation source 16 can be imprinted onto the printed circuit board 2 or be formed on the printed circuit board 2 by removing material. The actuator 18 can be connected via one or multiple bond wires 20, for example. According to a further alternative, an actuator 18 can be applied onto radiation source 16 on the printed circuit board 2. In this case, the actuator 18 or an integrated circuit 18 can, for example, be soldered to at least one radiation source 16 by a ball grid array. The various possibilities for arranging the radiation source 16 and the actuator 18 can be realized depending on requirements for a necessary bandwidth and frequency of the electromagnetic radiation.

The receiving unit 6 can be connected to the housing 4. In particular, the receiving unit 6 can be latched onto the housing 4 or pushed into the housing. The housing 4 can thus serve as a protection or a cover for the radiation source 16 and as a mechanical attachment of the receiving unit onto the printed circuit board. The radiation source 16 can have one or more antennas. In particular, the radiation source 16 can also be an array of antennas. The receiving unit 6 can receive and align the dielectric waveguide 10. For this purpose, the receiving unit 6 can have, for example, a receiving opening formed according to a cross-section of the dielectric waveguide 10. For example, the receiving unit 6 can have a cylindrical opening. The dielectric waveguide 10 can be introduced into the receiving unit 6 up to a defined depth. For this purpose, the receiving unit 6 can have limiting elements or latching lugs for cooperating with corresponding recesses arranged at the end of the dielectric waveguide 10. The dielectric waveguide 10 can also have end sleeves at the end. The end sleeves can be received by a receiving unit 6 and thus used indirectly for positioning or aligning the dielectric waveguide 10. The receiving unit can be used for precisely aligning and positioning at least one dielectric waveguide 10. The dielectric waveguide 10 can be aligned and positioned by the receiving unit 6 relative to the radiation source 16. The dielectric waveguide 16 can preferably be aligned such that the radiation source 16, without a spacing, can couple the electromagnetic radiation into the dielectric waveguide 10. The electromagnetic radiation can be, for example, a radio wave signal, a radar wave signal or the like. Moreover, the dielectric waveguide 10 can be aligned, at its ends, perpendicular to a main lobe of the radiation source 16 by the receiving unit 6, such that losses during a transition of the electromagnetic radiation into the dielectric waveguide can be minimized. The entire electromagnetic radiation emitted by the radiation source 16 can preferably be introduced and thus coupled into, the dielectric waveguide. As a result of this, a plug connection arrangement for dielectric waveguides can be realized with minimal coupling losses between a radiation source and a dielectric waveguide. In particular, the dielectric waveguide 10 can be optimally aligned with different radiation patterns of the radiation source 16 by the receiving unit 6.

FIG. 3 is a perspective view of a plug connection arrangement 1 according to a second exemplary embodiment of the present invention. The actuator 18 of the radiation source 16 is positioned on the printed circuit board 2, in the form of an integrated circuit 18, by surface-mounting. The radiation source 16 is integrated in the actuator 18. According to this exemplary embodiment of the present invention, the radiation source 16 is a so-called "broadside" antenna which has a directivity which is orthogonal to its planar elongation. The radiation source 16 can be a patch antenna or an array of patch antennas, for example. The housing 4 is positioned over the radiation source 16 in order to enclose and cover the radiation source 16, at least in sections. The housing 4 is mechanically connected to the printed circuit board 2 and serves as a positioning aid and form-fitting receptacle for the receiving unit 6. In this case, the receiving unit 6 can be plugged and engaged vertically onto the housing 4. The receiving unit 6 has a vertically configured opening 8 for receiving and positioning the dielectric waveguide 10. The waveguide 10 is positioned perpendicular to the planar elongation of the printed circuit board 2 by the receiving unit 6. In this state, the dielectric waveguide 10 is electromagnetically coupled to the radiation source 16 and can receive and guide the generated electromagnetic radiation. The arrow illustrates the radiation direction of the radiation source 16.

Figure 4A:
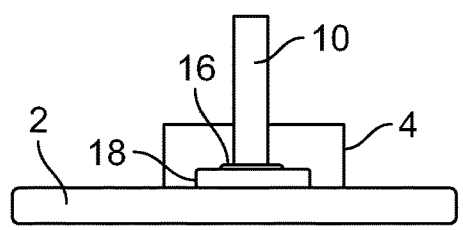
FIGS. 4a, 4b, and 4c are sectional views of various arrangements of a signal source in the FIG. 3 plug connection arrangement.
Figure 4B:
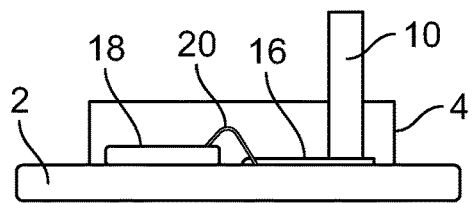
Figure 4C:
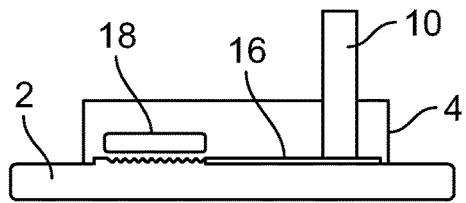

FIGS. 4a, 4b, and 4c are sectional views of various arrangements of a radiation source 16 in the FIG. 3 plug connection arrangement 1. In contrast to the arrangement possibilities shown in FIGS. 2a, 2b, and 2c according to the FIG. 3 exemplary embodiment of the present invention, the radiation sources are arranged with a radiation direction perpendicular to the planar elongation of the printed circuit board 2.

Figure 5:
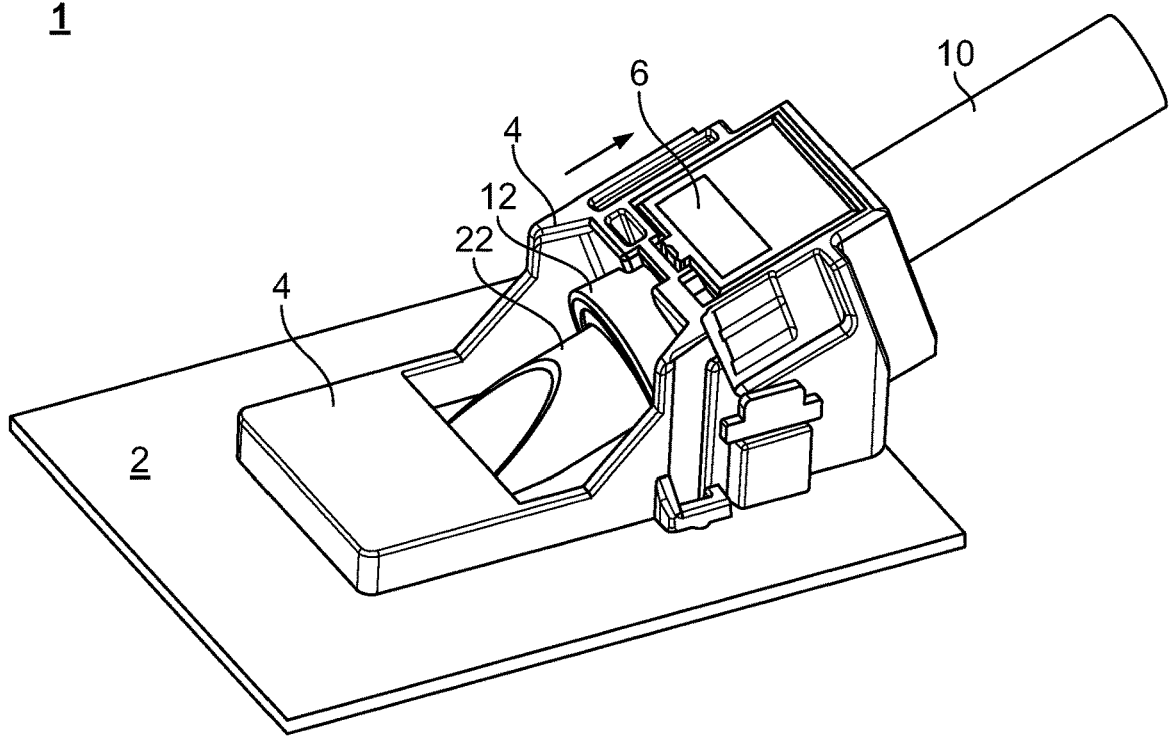
FIG. 5 is a perspective view of a plug connection arrangement according to a third exemplary embodiment of the present invention.

FIG. 5 is a perspective view of a plug connection arrangement 1 according to a third exemplary embodiment of the present invention. In contrast to the previously described exemplary embodiments of the present invention, the plug connection arrangement has a radiation source 16 with a radiation direction tilted at an angle of 45° relative to the printed circuit board 2. The arrow illustrates the propagation direction of a main lobe of the radiation source. The one radiation source 16 can be, for example, an "endfire" antenna with a subsequent reflector, a subsequent lens, or a subsequent conductor. Moreover, the one radiation source 16 can be a phased-array antenna made of patch antennas or dipole antennas. The receiving unit 6 is arranged in the housing 4 and can receive the dielectric waveguide 10 in an aligned manner corresponding to the radiation direction of the radiation source 16. In this case, the dielectric waveguide 10 is positioned by the receiving unit 6 in an aligned manner at an angle of 45° relative to the main beam of the radiation source 16. In order for the spacing between the radiation source 16 and the dielectric waveguide 10 to be minimal, the dielectric waveguide 10 does not end with the end-sleeve 12, but instead projects into the housing 4 via the end-sleeve 12 with an extension section 22 up to the radiation source 16.

Figure 6A:
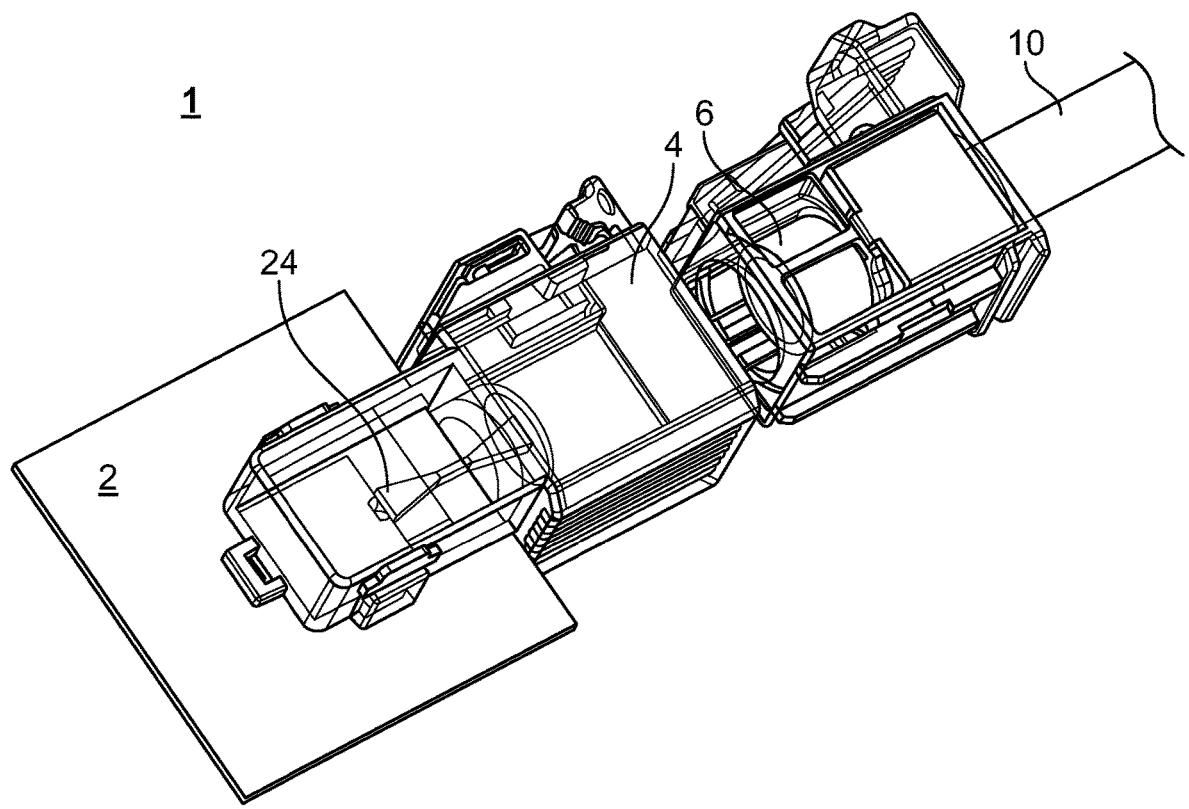
FIG. 6a is an exploded perspective view of a plug connection arrangement according to a fourth exemplary embodiment.

FIG. 6a is an exploded perspective view of a plug connection arrangement 1 according to a fourth exemplary embodiment of the present invention. In contrast to the plug connection arrangement 1 according to the FIGS. 1a and 1b embodiment of the present invention, the FIG. 6a plug connection arrangement 1 has a connecting element 24. The connecting element 24 serves as a coupling between the radiation source 16 and the dielectric waveguide 10. The connecting element 24 is in the housing 4 between the radiation source 16 and an end of the dielectric waveguide 10. Various spacings between the radiation source 16 and the dielectric waveguide 10 can be bridged in the inserted state by the connecting element 24. In this case, the connecting element 24 serves as a metallic waveguide.

Figure 6B:
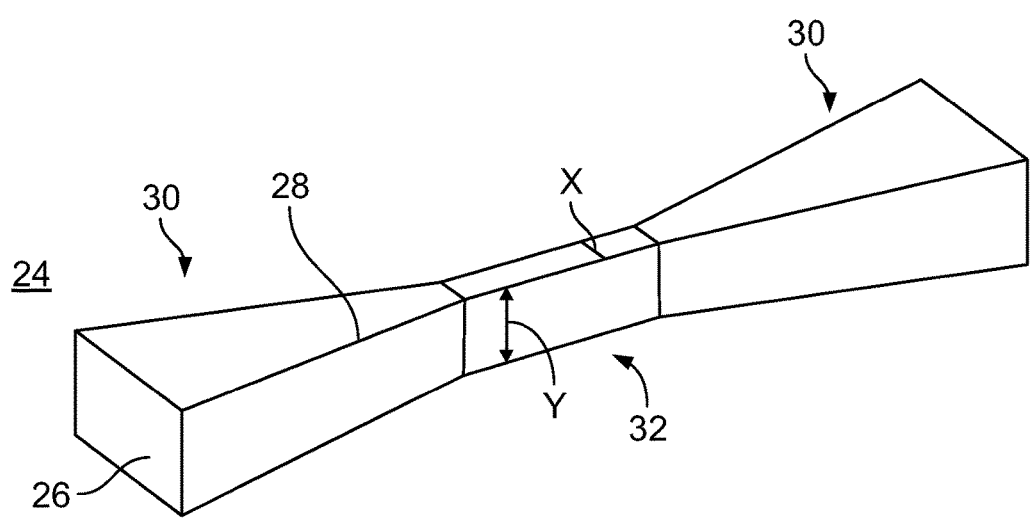

FIG. 6b is a perspective view of the one-part connecting element 24 of the FIG. 6a plug connection arrangement 1. The connecting element 24 is straight and has a rectangular cross-section. The connecting element 24 has an inner volume 26, which is permeable for electromagnetic radiation and made of a plastics material, and a metallized outer lateral surface 28. The connecting element 24 has, at each of its ends, a region 30 with a cross-section which is conically expanded at the end. The connecting element 24 has, between the end regions with conically expanded cross-sections 30, a central region 32 for low-loss transmission of electromagnetic rays. The central region 32 has a greater height y than a half propagation wavelength of the electromagnetic radiation and a smaller width x than the height y. As a result of this, a so-called "single-mode" propagation of the electromagnetic radiation can be realized in the central region 32.

The connecting element 24 can, for example, consist of a polymer, such as PE, PTEE, PFA, PP or the like, and be provided with a metallic coating. Alternatively, the connecting element 24 can be configured in the form of a bore metallized on the inside or in the form of a metal tube or metal profile. As a result, the connecting element 24 can be technically simple to produce, with a subsequent adaptation, such as by applying heat and pressure, to different spaces between the radiation source and the dielectric waveguide being possible.

Figure 7A:
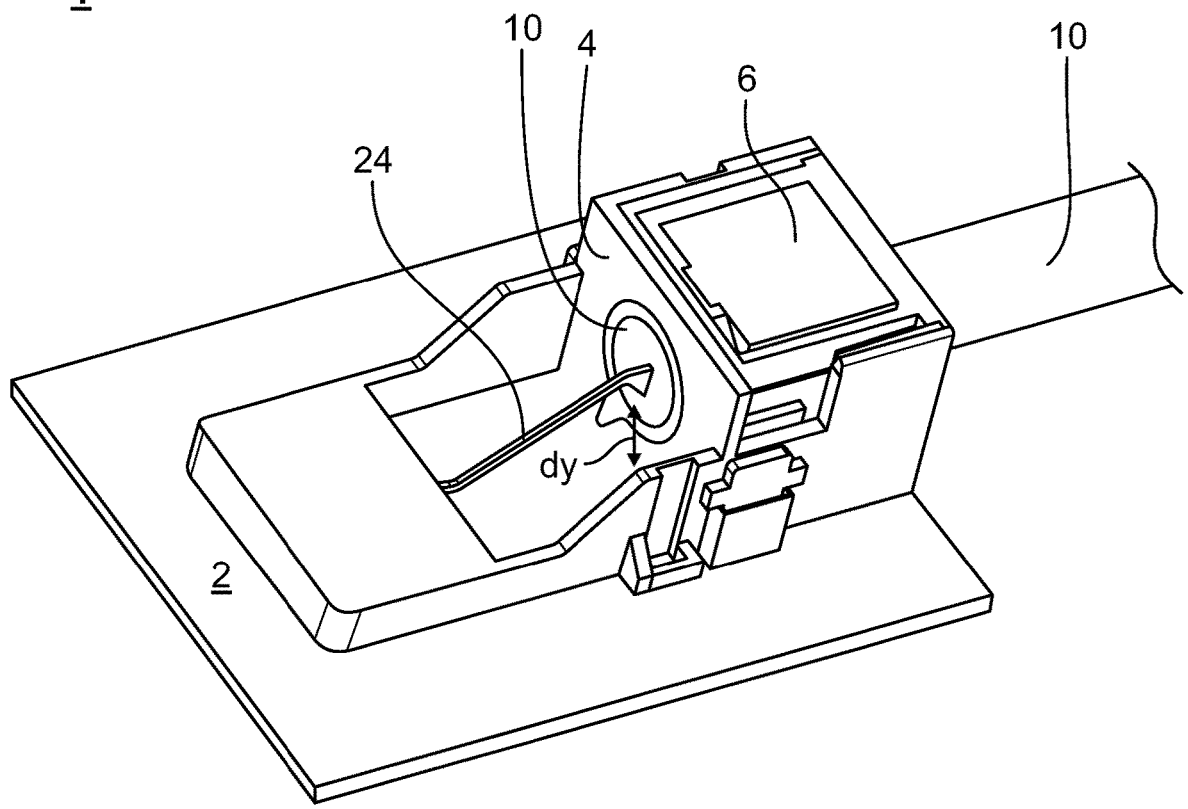
FIG. 7a is a perspective view of a plug connection arrangement according to a fifth exemplary embodiment of the present invention.
Figure 7B:
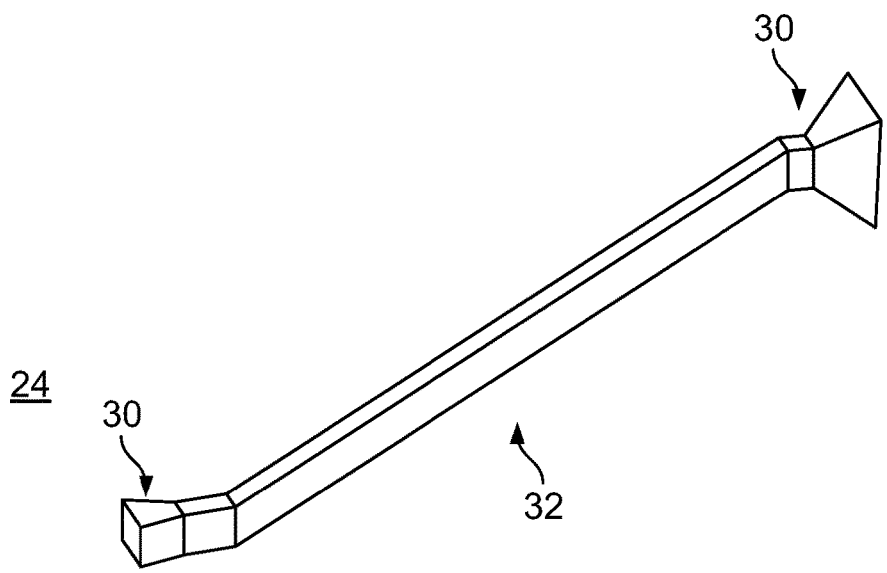

FIG. 7a is perspective view of a plug connection arrangement 1 according to a fifth exemplary embodiment of the present invention. In contrast to the FIGS. 6a and 6b exemplary embodiment of the present invention, the dielectric waveguide 10 is spaced apart, at its end, from the printed circuit board 2 and, thus, has a height offset dy from a radiation source 16 on the printed circuit board 2. The connecting element 24, illustrated in FIG. 7b is bent in the central region 32, such that the spacing between the radiation source 16 and the dielectric waveguide 10 can be bridged with low losses. In particular, the central region 32 is bent such that the electromagnetic radiation is perpendicularly and directly coupled into the connecting element 24 and subsequently can be perpendicularly coupled out of the connecting element 24 into the dielectric waveguide 10. As a result of this, the dielectric waveguide 10 can be received by the receiving unit 6 in a horizontal manner. Moreover, the dielectric waveguide 10 ends with the end-sleeve 12, as a result of which a production can be simplified and a durability of the dielectric waveguide 10 can be increased. FIG. 7b is a perspective view that separately illustrates the one-part connecting element 24 of the plug connection arrangement 1 of FIG. 7a.

Alternatively to a connecting element designed in one part, the connecting element can also be formed in multiple parts. In particular, the connecting element can, for example, be assembled into an electromagnetically conductive channel, by way of two or more metallically coated shells wherein, in each part, a metallically coated channel half can be configured as a groove. The electromagnetic radiation is weakened or attenuated less by the air in the conductive channel than by a plastics material.

Figure 8A:
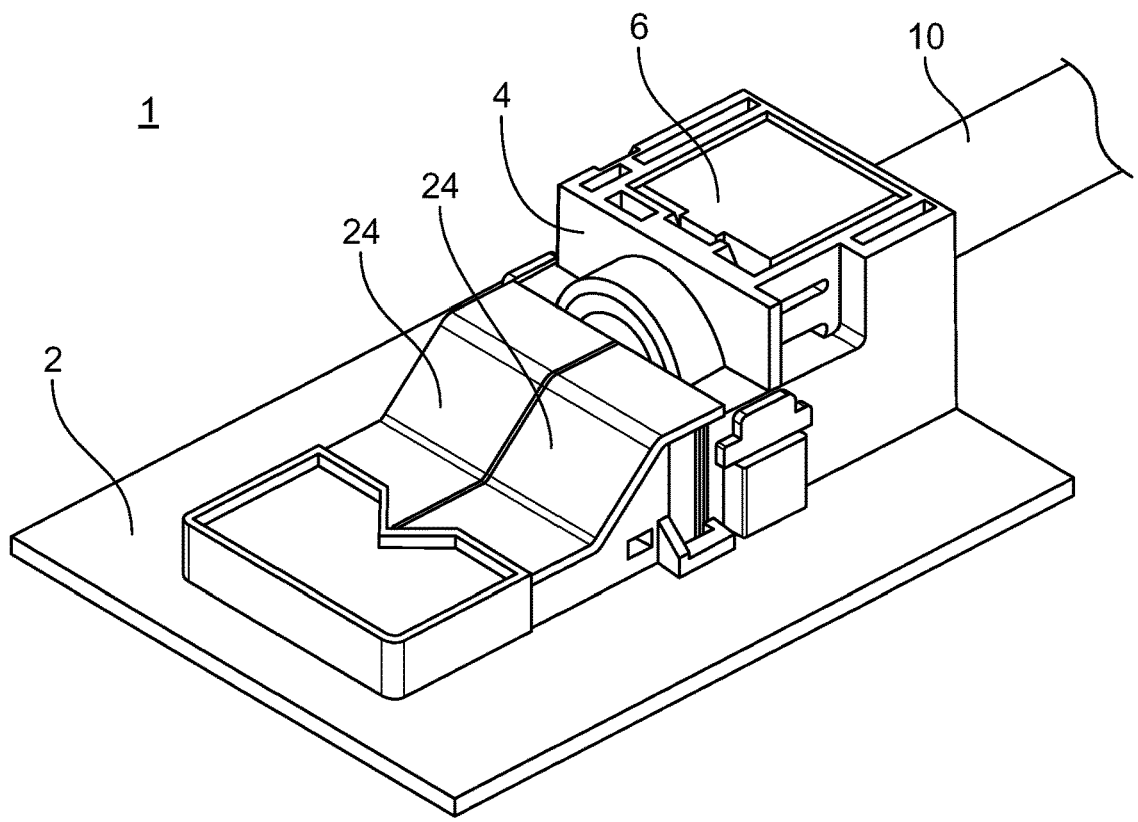
FIG. 8a is a perspective view of a plug connection arrangement according to a sixth exemplary embodiment of the present invention.

FIG. 8a is a perspective view of a plug connection arrangement 1 according to a sixth exemplary embodiment of the present invention. In contrast to the preceding exemplary embodiments of the plug connection arrangement 1, the housing 4 has an intermediate space between the dielectric waveguide 10 and the radiation source 16. In the intermediate space, a two-part connecting element 24 is connected to the housing in a form-fitting manner. Here, the two-part connecting element 24, similarly to a one-part connecting element 24, electromagnetically couples the radiation source 16 to the dielectric waveguide 10.

Figure 8B:
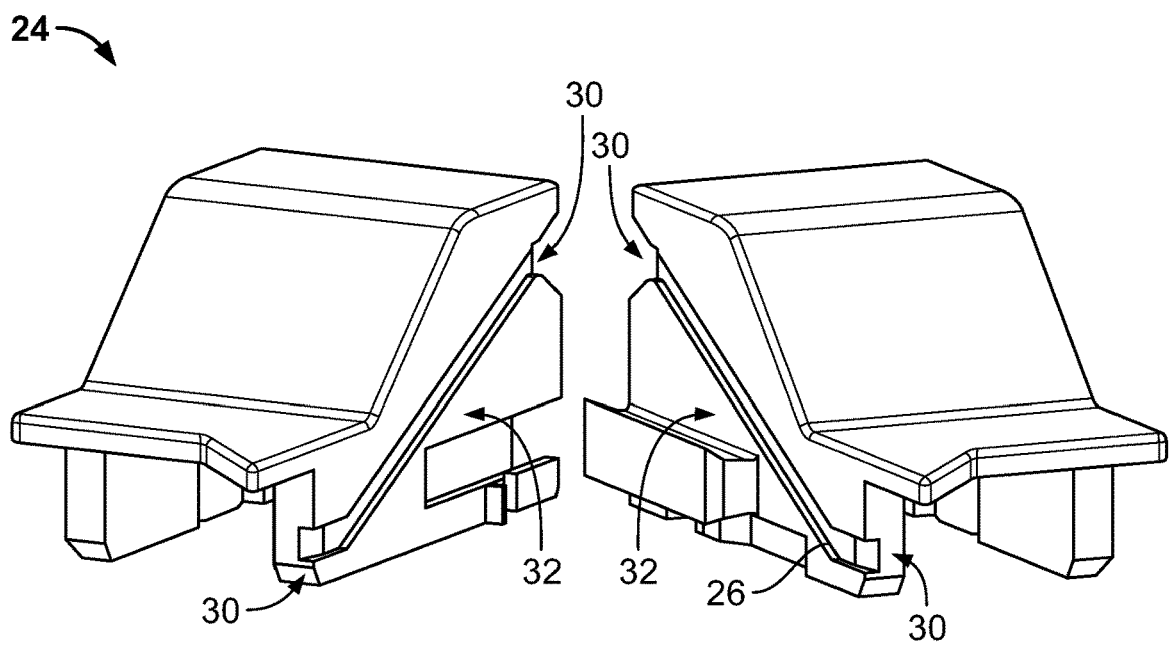

FIG. 8b is a perspective view of the multi-part connecting element 24 of the FIG. 8a plug connection arrangement 1. The construction of the connecting element 24 is illustrated. Each half of the connecting element 24 has a cavity which defines the inner volume 26 of the connecting element 24. In this case, the cavity is coated with a metal and thus forms a metallic waveguide. The two parts of the connecting element 24 can be connected to one another in a form-fitting manner and can be inserted into the housing 4 together as a unit. The inner volume 26 is filled with air, according to this exemplary embodiment of the present invention.

The connecting element can be divided into three parts. The region directed towards the radiation source is increased in height and in width and thus also in cross-section in order to improve coupling-in. The dimensions are preferably dependent on the kind of the at least one radiation source and the carrier frequency of the electromagnetic radiation. The central region preferably has a constant rectangular cross-section for guiding the electromagnetic radiation. The central region preferably has such a height and width that a single-mode propagation of the electromagnetic radiation and as a result a transmission with as low a loss as possible of the electromagnetic radiation can be performed. The cross-section of third region of the connecting element is also increased. The third region is here adapted to the material of the dielectric waveguide and to the carrier frequency of the electromagnetic radiation. The cross-sections of the first and the third region are preferably conically widened at the ends.

In particular, the central region can be adapted such that, for example, height differences can be compensated by a bent shape. The at least one dielectric waveguide can be arranged in the receiving unit, spaced apart from the printed circuit board, and the at least one radiation source can be formed on the printed circuit board.

FIG. 9 is a side view of a system 34 for transmitting data according to an exemplary embodiment of the present invention. The system 34 has a first controller 36 and a second controller 38. Each controller 36, 38 has one plug connection arrangement 1 in a controller housing 40. In this case, the plug connection arrangements 1 of the controllers 34, 36 are such that they are each on the rims of the printed circuit boards 2 and project out of the controller housings 40 at least in sections. As a result of this, the plug connection arrangements 1 do not have to be electromagnetically coupled into the controllers 36, 38 via further dielectric waveguides 10 and couplings. The two controllers 36, 38 are electromagnetically coupled to one another via an externally arranged dielectric waveguide 10 and can exchange information with one another with the help of the electromagnetic radiation.

It will be understood that implementations of the present invention might include multiple radiation sources 16, multiple dielectric waveguides 10, and multiple receiving units 6 and that such implementations of the present invention come with the scope of the claims.

What is claimed is:

1. A plug connection arrangement for mechanically and electromagnetically coupling a radiation source to a dielectric waveguide and comprising:
    a housing adapted to be mounted on a printed circuit board;
    a radiation source for generating electromagnetic waves enclosed at least in sections by the housing;
    a dielectric waveguide electromagnetically coupled to the radiation source directly or through the material of the housing;
    a receiving unit receiving and aligning the dielectric waveguide and connected to the housing; and
    an actuator for the radiation source arranged in the housing.

2. The plug connection arrangement according to claim 1, wherein the housing is adapted to be mounted on an edge of the printed circuit board and the radiation source is in the housing and/or adapted to be on the printed circuit board.

3. The plug connection arrangement according to claim 1, wherein the dielectric waveguide received by the receiving unit is aligned parallel to a planar elongation of the printed circuit board.

4. The plug connection arrangement according to claim 1, wherein the dielectric waveguide received by the receiving unit is aligned perpendicular to a planar elongation of the printed circuit board.

5. The plug connection arrangement according to claim 1, wherein the dielectric waveguide received by the receiving unit is aligned at an angle between 0° and 90° relative to a planar elongation of the printed circuit board.

6. The plug connection arrangement according to claim 5, wherein the dielectric waveguide received by the receiving unit in the housing extends beyond the receiving unit to the radiation source.

7. The plug connection arrangement according to claim 1, further including a connecting element between the radiation source and the dielectric waveguide to electromagnetically couple the radiation source to the dielectric waveguide.

8. The plug connection arrangement according to claim 1, wherein the connecting element is tubular and has an air-filled or plastics-filled inner volume and a wall made of metal or made of a metal coating.

9. The plug connection arrangement according to claim 2, wherein the connecting element has a rectangular cross-section and an air-filled or plastics-filled inner volume.

10. The plug connection arrangement according to claim 2, wherein the connecting element has, at each end, a region with a conically expanded cross-section.

11. The plug connection arrangement according to claim 10, wherein the connecting element has a central region between the end regions that has a rectangular cross-section with a height of a half propagation wavelength of the electromagnetic radiation and a smaller width than the height.

12. The plug connection arrangement according to claim 2, wherein the connecting element is straight.

13. The plug connection arrangement according to claim 2, wherein the connecting element is bent.

14. The plug connection arrangement according to claim 13, wherein the connecting element is in one part or in multiple parts and inserted into the housing in a form-fitting or firmly-bonded manner.

15. The plug connection arrangement according to claim 2, wherein the connecting element is in one part or in multiple parts and inserted into the housing in a form-fitting or firmly-bonded manner.

16. A system for transmitting data by electromagnetic radiation between a first controller and a second controller with each controller having a controller housing with one plug connection arrangement having:
    a housing adapted to be mounted on a printed circuit board;
    a radiation source for generating electromagnetic waves enclosed at least in sections by the housing;
    a dielectric waveguide electromagnetically coupled to the radiation source directly or through the material of the housing outside the controller housing;
    a receiving unit receiving and aligning the dielectric waveguide and connected to the housing; and
    an actuator for the radiation source arranged in the housing.

17. The system for transmitting data according to claim 16, wherein the housing of the plug connection arrangement is adapted to be mounted on an edge of the printed circuit board and the radiation source is in the housing and/or adapted to be on the printed circuit board.

18. The system for transmitting data according to claim 16, wherein the dielectric waveguide received by the receiving unit is aligned parallel to a planar elongation of the printed circuit board.

19. The system for transmitting data according to claim 16, wherein the dielectric waveguide received by the receiving unit is aligned perpendicular to a planar elongation of the printed circuit board.

20. A plug connection arrangement for mechanically and electromagnetically coupling a radiation source to a dielectric waveguide and comprising:
    a housing adapted to be mounted on a printed circuit board;
    a radiation source for generating electromagnetic waves enclosed at least in sections by the housing;
    a dielectric waveguide electromagnetically coupled to the radiation source directly or through the material of the housing;
    a receiving unit receiving and aligning the dielectric waveguide and connected to the housing; and a connecting element between the radiation source and the dielectric waveguide to electromagnetically couple the radiation source to the dielectric waveguide, the connecting element is tubular and has an air-filled or plastics-filled inner volume and a wall made of metal or made of a metal coating.

21. A plug connection arrangement for mechanically and electromagnetically coupling a radiation source to a dielectric waveguide and comprising:
 a housing adapted to be mounted on a printed circuit board;
 a radiation source for generating electromagnetic waves enclosed at least in sections by the housing;
 a dielectric waveguide electromagnetically coupled to the radiation source directly or through the material of the housing;
 a receiving unit receiving and aligning the dielectric waveguide and connected to the housing; and
 a connecting element between the radiation source and the dielectric waveguide to electromagnetically couple the radiation source to the dielectric waveguide, the connecting element has, at each end, a region with a conically expanded cross-section.

22. The plug connection arrangement according to claim 21, wherein the connecting element has a central region between the end regions that has a rectangular cross-section with a height of a half propagation wavelength of the electromagnetic radiation and a smaller width than the height.

* * * * *